(12) United States Patent
Liu

(10) Patent No.: US 12,538,476 B2
(45) Date of Patent: Jan. 27, 2026

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 647 days.

(21) Appl. No.: 17/954,648

(22) Filed: Sep. 28, 2022

(65) Prior Publication Data
US 2023/0015533 A1 Jan. 19, 2023

Related U.S. Application Data

(63) Continuation of application No. PCT/CN2022/094114, filed on May 20, 2022.

(30) Foreign Application Priority Data

Dec. 21, 2021 (CN) .......................... 202111570795.6

(51) Int. Cl.
*H10B 12/00* (2023.01)
*H01L 21/311* (2006.01)
*H01L 21/762* (2006.01)

(52) U.S. Cl.
CPC ...... *H10B 12/485* (2023.02); *H01L 21/31116* (2013.01); *H01L 21/76224* (2013.01); *H10B 12/315* (2023.02)

(58) Field of Classification Search
CPC .......................... H10B 12/485; H10B 12/315; H10B 12/0335; H10B 12/482; H01L 21/31116; H01L 21/76224; H01L 21/764
See application file for complete search history.

(56) References Cited

U.S. PATENT DOCUMENTS

| 9,356,073 | B1 | 5/2016 | Kim |
| 10,453,796 | B2 | 10/2019 | Song |
| 10,930,655 | B2 | 2/2021 | Kim et al. |
| 11,205,652 | B2 | 12/2021 | Lee |

(Continued)

FOREIGN PATENT DOCUMENTS

| CN | 108206184 A | 6/2018 |
| CN | 110718502 A | 1/2020 |

(Continued)

*Primary Examiner* — Yasser A Abdelaziez
(74) *Attorney, Agent, or Firm* — Syncoda LLC; Feng Ma

(57) ABSTRACT

A semiconductor structure and a method for forming a semiconductor structure are provided. The method includes: a substrate is provided; bit line contact holes spaced apart from each other, bit line contacts each in contact with a part of a respective one of the bit line contact holes, and bit line structures are formed on the substrate, where each of the bit line structures includes at least a conductive layer and an insulating cap layer, and the insulating cap layer is located on the conductive layer; first insulating layers completely filling the bit line contact holes are formed inside the bit line contact holes; and insulation structures with air interlayers are formed on two side walls of the bit line structures, where a height of each of the air interlayers is greater than a height of the conductive layer of each of the bit line structures.

17 Claims, 25 Drawing Sheets

(56) References Cited

U.S. PATENT DOCUMENTS

| | | | |
|---|---|---|---|
| 2010/0285662 A1* | 11/2010 | Kim | H01L 21/76831 |
| | | | 257/E21.585 |
| 2014/0008716 A1* | 1/2014 | Arigane | H10B 43/40 |
| | | | 257/314 |
| 2018/0174971 A1* | 6/2018 | Song | H10B 12/033 |
| 2019/0348418 A1 | 11/2019 | Hwang et al. | |
| 2020/0020697 A1 | 1/2020 | Kim et al. | |
| 2020/0203354 A1 | 6/2020 | Lee et al. | |

FOREIGN PATENT DOCUMENTS

| | | |
|---|---|---|
| CN | 111354711 A | 6/2020 |
| CN | 113690219 A | 11/2021 |

* cited by examiner

SEMICONDUCTOR STRUCTURE AND METHOD FOR FORMING SEMICONDUCTOR STRUCTURE

CROSS-REFERENCE TO RELATED APPLICATIONS

This application is a continuation application of International Patent Application No. PCT/CN2022/094114, filed on May 20, 2022, which claims priority to Chinese Patent Application No. 202111570795.6, entitled "SEMICONDUCTOR STRUCTURE AND METHOD FOR FORMING SEMICONDUCTOR STRUCTURE" and filed on Dec. 21, 2021. The disclosures of International Patent Application No. PCT/CN2022/094114 and Chinese Patent Application No. 202111570795.6 are hereby incorporated by reference in their entireties.

BACKGROUND

A semiconductor device, for example, a dynamic random access memory (DRAM), includes a plurality of storage cells, a word line (WL), and a bit line (BL). Each storage cell usually includes a transistor and a capacitor. The gate of the transistor is connected to the WL, the drain area or the source area of the transistor is connected to the BL, and the source area or the drain area of the transistor is connected to the capacitor. A voltage signal applied to the WL can control turning on or turning off of the transistor, and then data information stored in the capacitor is read through the BL, or the data information is written into the capacitor through the BL for storage.

The semiconductor device may further include a storage node contact (NC) and a bit line contact (BLC). The NC is configured to be electrically connected to the source/drain area and other parts in the semiconductor structure, and the BLC is configured to be electrically connected to the active area and the BL. With the high integration of semiconductor storage devices, the distance between BL and NC becomes shorter, resulting in an increase in the parasitic capacitance between the BL and the NC, and then leading to a decrease in the sensing tolerance and the reading speed of the memories.

SUMMARY

Embodiments of this disclosure relate to a semiconductor structure and a method for forming a semiconductor structure.

According to a first aspect, an embodiment of this disclosure provides a method for forming a semiconductor structure. The method includes the following operations. A substrate is provided. Bit line contact holes spaced apart from each other, bit line contacts each in contact with a part of a respective one of the bit line contact holes, and bit line structures are formed on the substrate, where each of the bit line structures includes at least a conductive layer and an insulating cap layer, and the insulating cap layer is located on the conductive layer. First insulating layers completely filling the bit line contact holes are formed inside the bit line contact holes. Insulation structures with air interlayers are formed on two side walls of the bit line structures, where a height of each of the air interlayers is greater than a height of the conductive layer of each of the bit line structures.

According to a second aspect, an embodiment of this disclosure provides a semiconductor structure, including: a substrate; bit line contact holes spaced apart from each other, bit line contacts each in contact with a part of a respective one of the bit line contact holes, and bit line structures, where the bit line contact holes, the bit line contacts and the bit line structures are located on the substrate, each of the bit line structures includes at least a conductive layer and an insulating cap layer, and the insulating cap layer is located on the conductive layer; first insulating layers located inside the bit line contact holes, where the first insulating layers completely fill the bit line contact holes; and insulation structures with air interlayers located on two side walls of the bit line structures, where a height of each of the air interlayers is greater than a height of the conductive layer of each of the bit line structures.

DETAILED DESCRIPTION

Figure 1A:
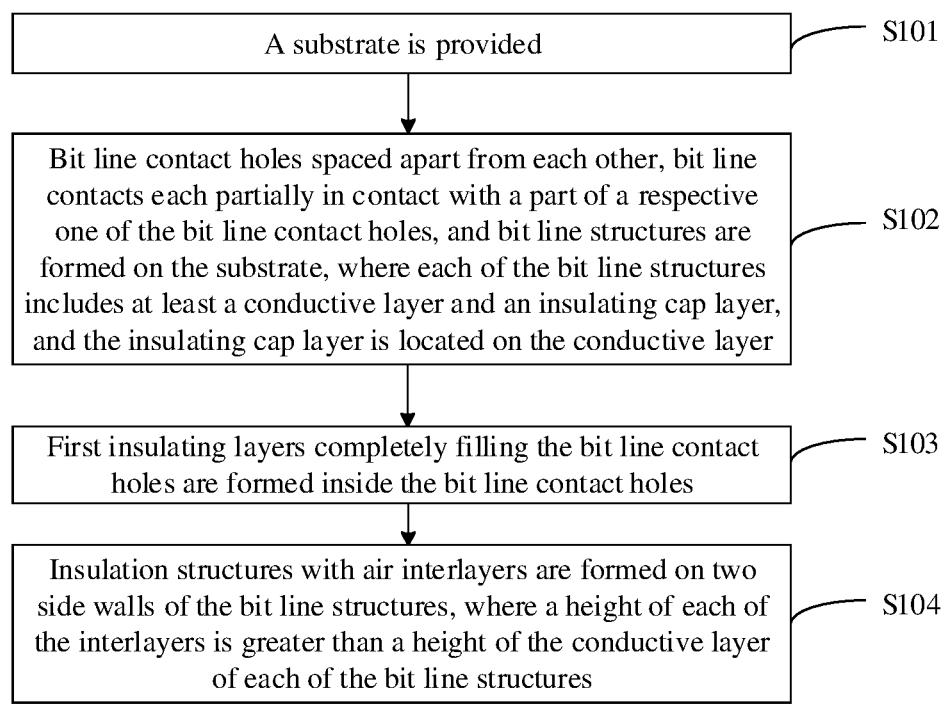
FIG. 1A is a schematic flowchart of a method for forming a semiconductor structure according to an embodiment of this disclosure.

The following describes exemplary implementations disclosed in this disclosure below in more detail with reference to the accompanying drawings. Although the exemplary implementations of this disclosure are shown in the accompanying drawings, it should be understood that this disclosure may be implemented in various forms, and is not limited by the specific implementations described herein. Rather, these implementations are provided, so that this disclosure is more thoroughly understood, and the scope of this disclosure is completely conveyed to a person skilled in the art.

In the following description, numerous specific details are given to facilitate a more thorough understanding of this disclosure. However, for a person skilled in the art, it is apparent that this disclosure may be implemented without at least one of these details. In other instances, to avoid obscuring this disclosure, some technical features that are well-known in the art have not been described. That is, not all features of an actual embodiment are described herein, and well-known functions and constructions are not described in detail.

In the accompanying drawings, the dimensions of layers, regions, elements, and relative dimensions thereof may be exaggerated for clarity. The same reference numerals refer to the same elements throughout the description.

It will be understood that when an element or layer is referred to as being "on", "adjacent to", "connected to", or "coupled to" another element or layer, it may be directly on, adjacent to, connected to, or coupled to the another element or layer, or an intermediate element or layer may exist. In contrast, when an element is referred to as being "directly on", "directly adjacent to", "directly connected to", or "directly coupled to" another element or layer, no intermediate element or layer exists. It will be understood that, although the terms first, second, third, and the like may be used to describe various elements, components, regions, layers, and/or parts, these elements, components, regions, layers, and/or parts should not be limited by these terms. These terms are only used to distinguish one element, component, region, layer, or part from another element, component, region, layer, or part. Therefore, a first element, component, region, layer, or part discussed below could be represented as a second element, component, region, layer, or part without departing from the teachings of this disclosure. When a second element, component, region, layer, or part is discussed, it does not indicate that a first element, component, region, layer, or part necessarily exists in this disclosure.

The terms used herein are for the purpose of describing specific embodiments only and are not intended to be limiting of this disclosure. As used herein, the singular forms "a", "an", and "the" are intended to include the plural forms as well, unless the context clearly dictates otherwise. It is also to be understood that the terms "constitute" and/or "include", when used in this specification, identify the presence of stated features, integers, steps, operations, elements, and/or components, but do not exclude the presence or addition of one or more other features, integers, steps, operations, elements, components, and/or groups. As used herein, the term "and/or" includes any and all combinations of the associated listed items.

An embodiment of this disclosure provides a method for forming a semiconductor structure. As shown in FIG. 1A, the method includes the following operations.

At S101, a substrate is provided.

The substrate may be a silicon (Si) substrate, a germanium (Ge) substrate, a silicon germanium (SiGe) substrate, a gallium arsenide substrate, a ceramic substrate, a quartz substrate, or a glass substrate for a display, and may include a plurality of layers, such as a silicon on insulator (SOI) substrate or a germanium on insulator (GOI) substrate.

Shallow trench isolations (STIs) may be formed in the substrate to isolate multiple active areas formed in the substrate from each other. Trenches are formed in the substrate and then the trenches are filled with an isolation material layer to form the STIs. The material filled in the STIs may include silicon nitride, silicon oxide, and the like. The silicon oxide may be formed through thermal oxidation. The STIs may isolate multiple active areas, which are formed in the substrate in an array distribution or other distribution types, from each other.

In some embodiments, a buffer layer located above the STIs and the active areas may be formed in the substrate, and the buffer layer may include at least one insulating layer. The material of the buffer layer may include oxide of silicon, nitride of silicon, silicon oxynitride, and the like.

Figure 1B:
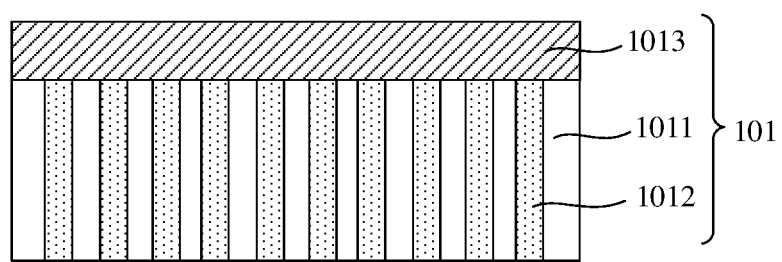
FIG. 1B to FIG. 2I are a schematic diagram of a process of a method for forming a semiconductor structure according to an embodiment of this disclosure.

For S101, references may be made to FIG. 1B. The provided substrate 101 includes active areas 1012, STIs 1011, and a buffer layer 1013. The STIs 1011 and the active areas 1012 are spaced apart from each other, and the buffer layer 1013 is located on the STIs 1011 and the active areas 1012.

At S102, bit line contact holes spaced apart from each other, bit line contacts each in contact with a part of a respective one of the bit line contact holes, and bit line structures are formed on the substrate.

The material for the bit line contacts may include, but not limited to, conductive materials such as polysilicon, for example, polysilicon doped with impurities or polysilicon without impurities. Each of the bit line structures includes at least a conductive layer and an insulating cap layer, and the insulating cap layer is located on the conductive layer.

Figure 1C:
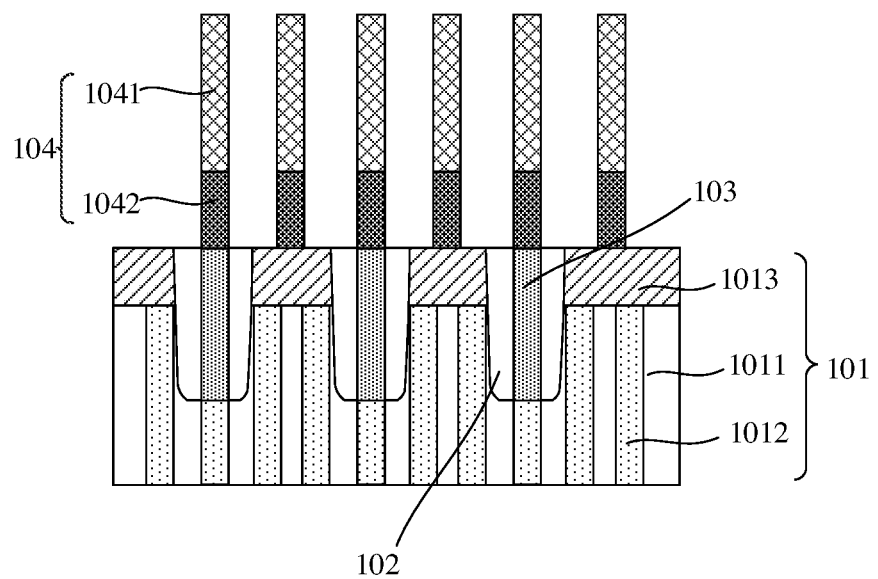

As shown in FIG. 1C, bit line contact holes 102 spaced apart from each other, bit line contacts 103 each in contact with a part of a respective one of the bit line contact holes 102, and bit line structures 104 are formed on the substrate 101. The bit line contact hole 102 runs through a part of the substrate 101, each of the bit line contacts 103 is located inside the respective one of the bit line contact holes 102, and there is a space in each of the bit line contact holes 102 not occupied by a respective one of the bit line contacts 103. Some of the bit line structures 104 are located on the bit line contacts 103, and are connected to the active areas 1012 by the bit line contacts 103, and other bit line structures 104 are located on the substrate 101. Each of the bit line structures 104 includes at least a conductive layer 1042 and an insulating cap layer 1041 located on the conductive layer 1042.

In an actual application, the material of the conductive layer may be one or more of polysilicon, metal silicide, conductive metal nitride (such as titanium nitride (TiN), tantalum nitride (TaN), and tungsten nitride (WN)), and metals (such as tungsten (W), titanium (Ti), and tantalum (Ta)). In an actual application, the material of the insulating cap layer may be at least one of oxide, nitride of silicon, or silicon oxynitride, and the insulating cap layer may be formed by using a chemical vapor deposition process.

In some other embodiments, each of the bit line structures may further include a diffusion barrier layer, where the diffusion barrier layer is located between the bit line contacts and the conductive layer. The diffusion barrier layer can insulate the conductive layer from the active areas, and can prevent metal ions in the conductive layer from entering the active areas. The diffusion barrier layer may include a single-layer structure, for example, a metal titanium layer; and may alternatively include a multi-layer structure, for example, a metal titanium layer and a titanium nitride layer.

At S103, first insulating layers completely filling the bit line contact holes are formed inside the bit line contact holes.

Figure 1D:
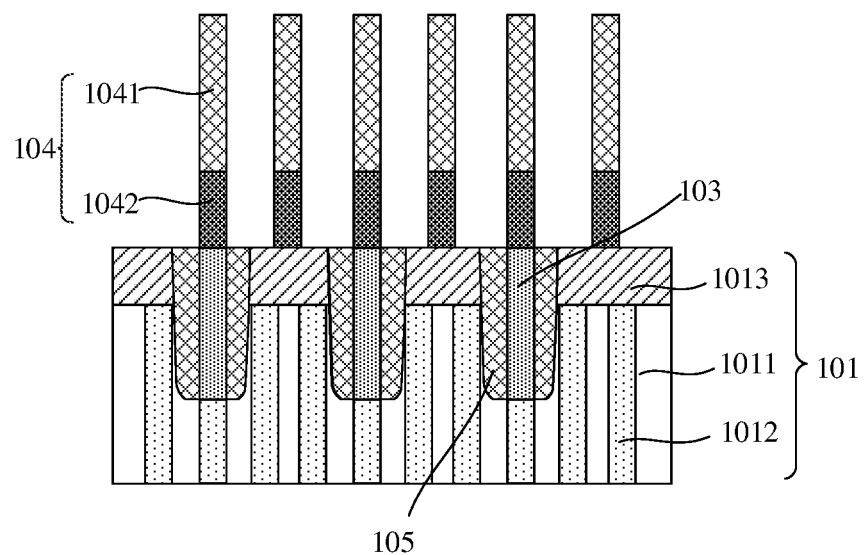

With reference to FIG. 1C and FIG. 1D, first insulating layers 105 (as shown in FIG. 1D) completely filling the bit line contact holes 102 are formed inside the bit line contact holes 102. The surface of the first insulating layer 105 is flush with the surface of the bit line contact hole 102. The first insulating layer herein is configured to reduce the damage of the BLC in subsequent processes.

The material for the first insulating layer may be nitride, and the nitride may include, but not limited to, silicon nitride, silicon oxynitride, and the like. In some embodiments, in order to facilitate controlling the thickness of the first insulating layer, the first insulating layer may be formed by using an atomic layer deposition process. In some other embodiments, other processes may alternatively be used to form the first insulating layer, such as a physical vapor deposition process, a chemical vapor deposition process, a low pressure chemical vapor deposition process, a molecular layer deposition process, and a plasma enhanced vapor deposition process.

In some embodiments, S103 may be implemented by the following operations. An initial first insulating layer is deposited on the upper surface of the substrate and the surfaces of the bit line contact holes, and then the initial first insulating layer located above the upper surface of the substrate is removed by etching, to form the first insulating layers completely filling the bit line contact holes.

At S104, insulation structures with air interlayers are formed on two side walls of the bit line structures, where a height of each of the air interlayers is greater than a height of the conductive layer of each of the bit line structures.

Each of the insulation structures herein may be in the form of a structure with insulating layers on both sides thereof and one air interlayer between the two insulating layers. That is, each of the insulation structures includes an insulating layer, an air interlayer, and another insulating layer from left to right. The material of the insulating layer may be silicon oxide, aluminum oxide, and the like. During implementation, the materials of the two insulating layers may be the same or different.

In some embodiments, in order to facilitate controlling the thickness of the insulating layers of the insulation structure, the insulating layers of the insulation structure may be formed by using the atomic layer deposition process. In some other embodiments, other processes may alternatively be used to form the insulating layers of the insulation structure, such as a physical vapor deposition process, a chemical vapor deposition process, a low pressure chemical vapor deposition process, a molecular layer deposition process, and a plasma enhanced vapor deposition process.

In some embodiments, S104 may be implemented by successively depositing first insulating layers, sacrificial layers, and second insulating layers on the surfaces of the bit line structures, then dry etching the middle sacrificial layers to form air interlayers, and subsequently depositing an insulating layer of the same material on the surfaces of second insulating layers, the surfaces of the air interlayers, and the surfaces of the first insulating layers to cover exposed voids on the surfaces of each of the air interlayers, to form the insulation structures with the air interlayers.

Figure 1E:
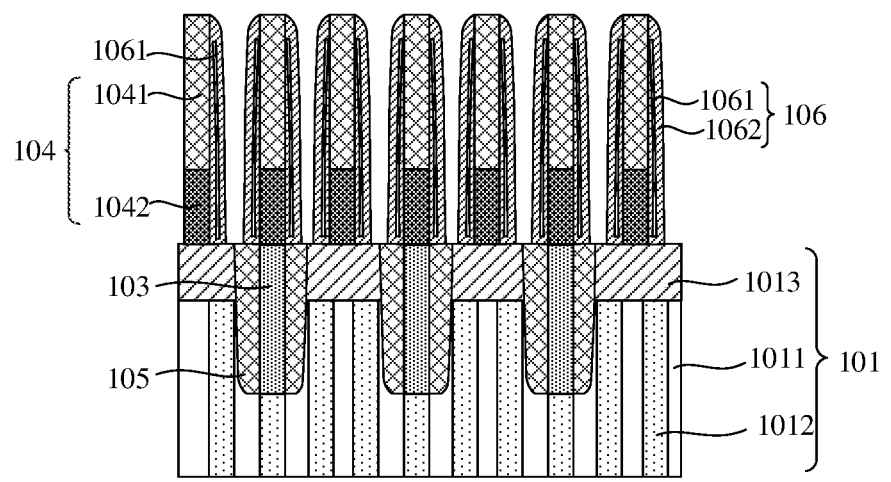

For S104, references may be made to FIG. 1E. Insulation structures 106 with air interlayers 1061 are formed on two side walls of the bit line structures 104, where insulating layers 1062 are arranged on the two sides of each of the air interlayers 1061, and a height of each of the air interlayers 1061 is greater than a height of the conductive layer 1042 of each of the bit line structures 104.

Because the height of each of the air interlayers herein is greater than the height of the conductive layer of each of the bit line structures, and the NC is between two adjacent BLs, a dielectric layer between the NC and BL changes from a single insulating layer to an insulating layer and an air interlayer. In addition, because a dielectric constant of the air interlayer is less than a dielectric constant of the insulating layer, the parasitic capacitance between the NC and the BL can be reduced.

In this embodiment of this disclosure, bit line contact holes spaced apart from each other, bit line contacts each in contact with a part of a respective one of the bit line contact holes, and bit line structures are formed on the substrate. The first insulating layers completely filling the bit line contact holes are formed inside the bit line contact holes. Insulation structures with air interlayers are formed on two side walls of the bit line structures, where the height of each of the air interlayers is greater than the height of the conductive layer of each of the bit line structures. Therefore, a new method for forming a bit line structure spacer, that is, insulation structures with air interlayers are provided in this embodiment of this disclosure. Because the insulation structures with air interlayers are arranged between the BL and the NC, and the dielectric constant of the air interlayers is less than the dielectric constant of an insulating layer of an insulation structure without an air interlayer, the parasitic capacitance between the NC and the BL is reduced, and the read capacity of the memory is improved.

Based on the method for forming the semiconductor structure shown in FIG. 1A, an embodiment of this disclosure provides a semiconductor structure. As shown in FIG. 1E, the semiconductor structure includes:
 a substrate 101;
 bit line contact holes (holes in which the first insulating layers 105 are located) spaced apart from each other, bit line contacts 103 each in contact with a part of a respective one of the bit line contact holes, and bit line structures 104, where the bit line contact holes, the bit line contacts 103 and the bit line structures 104 are located on the substrate 101, each of the bit line structures 104 includes at least a conductive layer 1042 and an insulating cap layer 1041, and the insulating cap layer 1041 is located on the conductive layer 1042;
 first insulating layers 105 located inside the bit line contact holes, where the first insulating layers 105 completely fill the bit line contact holes; and
 insulation structures 106 with air interlayers 1061 on two side walls of the bit line structures 104, where a height of each of the air interlayers 1061 is greater than a height of the conductive layer 1042 of each of the bit line structures 104.

In some embodiments, S102 include the following operations.

At S1021, bit line contact holes are formed on the substrate.

Herein, S1021 may be implemented by the following operations. A first photoresist layer is formed on the substrate, the first photoresist layer is patterned to form a first mask pattern with bit line contact hole patterns, and the substrate is etched by using the first mask pattern as a mask to form bit line contact holes.

The photoresist, also referred to as photo resister, is an etch-resistant film material of which the solubility is changed by irradiation or radiation of an ultraviolet light, an electron beam, an ion beam, an X-ray, and the like. The photoresist is sensitive to light and includes components such as a photosensitive resin, a sensitizer, and a solvent. During the photolithography process, the photoresist serves as an anti-corrosion coating material.

At S1022, first initial bit line contacts completely filling the bit line contact holes are deposited inside the bit line contact holes.

Herein, S1022 may be implemented by using a physical vapor deposition process, a chemical vapor deposition process, a low pressure chemical vapor deposition process, a molecular layer deposition process, a plasma enhanced vapor deposition process, or the like, to deposit the first initial bit line contacts completely filling the bit line contact holes inside the bit line contact holes.

In some embodiments, the operation that the first initial bit line contacts completely filling the bit line contact holes are deposited may be implemented by the following operations. Second initial bit line contacts are deposited inside the bit line contact holes and on the surface of the substrate, and then the second initial bit line contacts located above the upper surface of the substrate are removed through chemical mechanical polishing, to form the first initial bit line contacts.

At S1023, an initial conductive layer, an initial insulating cap layer, and a second photoresist layer are successively deposited on the upper surface of the substrate.

Herein, S1023 may be implemented by using a physical vapor deposition process, a chemical vapor deposition process, a low pressure chemical vapor deposition process, a molecular layer deposition process, a plasma enhanced vapor deposition process, or the like, to successively deposit the initial conductive layer, the initial insulating cap layer, and the second photoresist layer on the upper surface of the substrate.

At S1024, the second photoresist layer is patterned to form a second mask pattern with bit line structure patterns.

Herein, the operation that the second photoresist layer is patterned may include the following operations. The second photoresist layer is exposed and developed, and a part of the second photoresist layer is dissolved, where the undissolved parts of the second photoresist layer form the second mask pattern.

At S1025, the initial conductive layer and the initial insulating cap layer are etched by using the second mask pattern as a mask, to form the conductive layer and the insulating cap layer.

Herein, S1025 may be implemented by the following operation. The initial conductive layer and the initial insulating cap layer are etched by using a dry etching process (such as a reactive ion etching technology and a plasma etching technology), to form the conductive layer and the insulating cap layer.

At S1026, the second photoresist layer is removed.

Herein, S1026 may be implemented by the following operation. The second photoresist layer is removed by using a wet etching process or dry etching process.

At S1027, the first initial bit line contacts in the bit line contact holes are etched by using the conductive layers and the insulating cap layers as masks, to form the bit line contacts, where each of the bit line contacts is in contact with a part of a respective one of the bit line contact holes.

Herein, S1027 may be implemented by the following operation. The first initial bit line contacts in the bit line contact holes are etched by using a wet etching process or dry etching process, to form the bit line contacts.

In some embodiments, the operation that "insulation structures with air interlayers are formed on two side walls of the bit line structures" at S104 may include the following operations.

At S1041, second insulating layers, sacrificial layers, and third insulating layers are successively formed on the two side walls of the bit line structures, to expose part of a surface of each of the sacrificial layers.

Figure 2A:
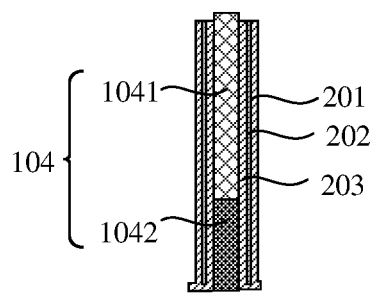
Figure 2B:
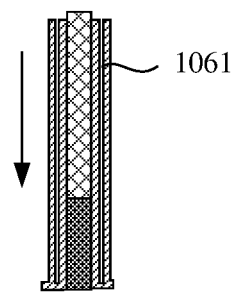
Figure 2C:
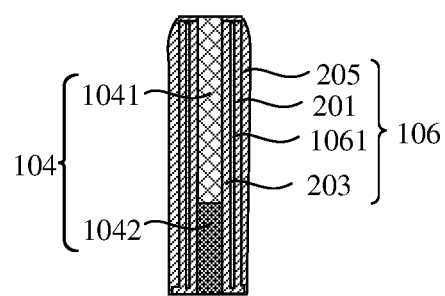

FIG. 2A to FIG. 2C show the formation process of insulation structures on two side walls of a bit line structure in FIG. 1E. As shown in FIG. 2A, second insulating layers 203, sacrificial layers 202, and third insulating layers 201 are successively formed on two side walls of the bit line structures 104, to expose part of a surface of each of the sacrificial layers 202, that is, the tops of the sacrificial layers 202. The upper surface of the second insulating layer 203, the upper surface of the sacrificial layer 202, and the upper surface of the third insulating layer 201 are flush with each other.

In some embodiments, S1041 may be implemented by the following operations. Initial second insulating layers, initial sacrificial layers, and initial third insulating layers are successively deposited on two side walls of the bit line structures, and then the initial second insulating layers, the initial sacrificial layers, and the initial third insulating layers located above the upper surfaces of the bit line structures are etched, to form the second insulating layers, the sacrificial layers, and the third insulating layers, where part of a surface of each of the sacrificial layers is exposed.

At S1042, the sacrificial layers are etched along a first direction, to form air interlayers, where the first direction is a direction perpendicular to the substrate.

With reference to FIG. 2A and FIG. 2B, the sacrificial layers 202 are etched along the first direction (the direction indicated by the arrow), to form the air interlayers 1061 shown in FIG. 2B, where the first direction is the direction perpendicular to the substrate. With reference to FIG. 1E, the first direction is the direction indicated by the arrow in FIG. 2B.

In some embodiments, S1042 may be implemented by the following operation. The sacrificial layers are etched along the first direction by using a dry etching process such as a reactive ion etching technology and a plasma etching technology, to form the air interlayers.

In this embodiment of this disclosure, by using a dry etching process and utilizing the anisotropy of dry etching to etch the sacrificial layers, the formation of the air interlayers is facilitated.

At S1043, fourth insulating layers covering the third insulating layers, the air interlayers, and the second insulating layers are formed, to obtain the insulation structures with air interlayers on the two side walls of the bit line structures, where the insulation structures include the second insulating layers, the air interlayers, the third insulating layers, and the fourth insulating layers that are successively stacked onto one another.

Herein, S1043 may be implemented by the following operation. The fourth insulating layers are formed on the upper surfaces of the bit line structures, the surfaces of the second insulating layers, the surfaces of the air interlayers, and the surfaces of the third insulating layers by using a deposition process, such as a physical vapor deposition process, a chemical vapor deposition process, a low pressure chemical vapor deposition process, a molecular layer deposition process, a plasma enhanced vapor deposition process, and an atomic layer deposition process.

The material for the fourth insulating layers may include oxide, such as silicon oxide and aluminum oxide. The material for the fourth insulating layers may at least be the same as the material for the second insulating layers or the third insulating layers, so that the fourth insulating layers can cover voids on the surfaces of the air interlayers.

As shown in FIG. 2C, fourth insulating layers 205 covering the third insulating layers 201, the air interlayers 1061, and the second insulating layers 203 are formed. That is, the fourth insulating layers 205 cover the surfaces of the third insulating layers, the surfaces of the air interlayers 1061, and the surfaces of the second insulating layers 203, to obtain the insulation structures 106 with air interlayers 1061 on two side walls of the bit line structures 104. The insulation structures 106 include second insulating layers 203, air interlayers 1061, third insulating layers 201, and fourth insulating layers 205 that are successively stacked onto one another.

In some embodiments, S1043 may include the following operations.

At S1431, initial fourth insulating layers are formed on upper surfaces of the bit line structures, surfaces of the second insulating layers, surfaces of the air interlayers, and surfaces of the third insulating layers.

Herein, the material for the initial fourth insulating layers may be at least the same as the material for the second insulating layers or the third insulating layers, so that the initial fourth insulating layers can cover voids on the surfaces of the air interlayers.

Figure 2D:
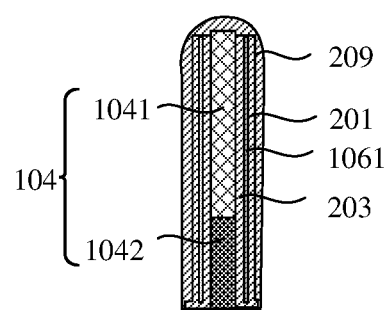

As shown in FIG. 2D, initial fourth insulating layers 209 are formed on the upper surfaces of the bit line structures 104, surfaces of the second insulating layers 203, surfaces of the air interlayers 1061, and surfaces of the third insulating layers 201.

At S1432, the initial fourth insulating layers located above tops of the bit line structures are etched, to form the fourth insulating layers covering the third insulating layers, the air interlayers, and the second insulating layers.

Herein, S1432 may be implemented by the following operation. The initial fourth insulating layers located above the tops of the bit line structures are etched by using a dry etching process, such as a reactive ion etching technology and a plasma etching technology.

Figure 2E:
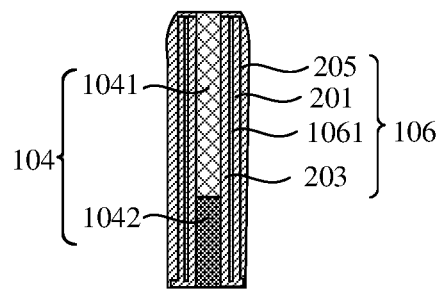

With reference to FIG. 2D and FIG. 2E, the initial fourth insulating layers 209 located above the tops of the bit line structures 104 are etched, to form the fourth insulating layers 205 covering the third insulating layers 201, the air interlayers 1061, and the second insulating layers 203 shown in FIG. 2E.

In this embodiment of this disclosure, second insulating layers, sacrificial layers, and third insulating layers are successively deposited on the surfaces of the bit line structures, and then the middle sacrificial layers are etched to form air interlayers; and subsequently fourth insulating layers are deposited on the surfaces of the second insulating layers, the surfaces of the air interlayers, and the surfaces of the third insulating layers, to cover voids exposed on the tops of the air interlayers, to form insulation structures with air interlayers.

In some embodiments, S1041 may include the following operations.

At S1411, initial second insulating layers and initial sacrificial layers are successively formed on surfaces of the bit line structures.

Figure 2F:
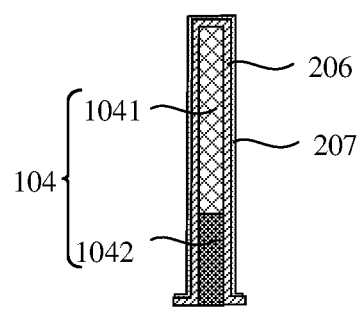

As shown in FIG. 2F, initial second insulating layers 206 and initial sacrificial layers 207 are successively formed on the surfaces of the bit line structures 104.

Herein, S1411 may be implemented by the following operation. The initial second insulating layers and the initial sacrificial layers are successively formed on the surfaces of the bit line structures by using a deposition process such as a physical vapor deposition process, a chemical vapor deposition process, a low pressure chemical vapor deposition process, a molecular layer deposition process, a plasma enhanced vapor deposition process, and an atomic layer deposition process.

The material for the initial second insulating layers may be oxide, such as silicon oxide, aluminum oxide, and the like. The material for the initial sacrificial layers may include polysilicon.

At S1412, the initial sacrificial layers located above tops of the bit line structures are etched, to form the sacrificial layers.

Figure 2G:
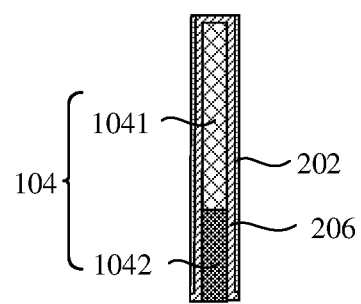

With reference to FIG. 2F and FIG. 2G, the initial sacrificial layers 207 located above tops of the bit line structures 104 are etched, to form the sacrificial layers 202 shown in FIG. 2G.

Herein, S1412 may be implemented by the following operation. The initial sacrificial layers located above the tops of the bit line structures are etched by using a dry etching process, such as a reactive ion etching technology and a plasma etching technology.

At S1413, initial third insulating layers are formed on surfaces of the initial second insulating layers and surfaces of the sacrificial layers.

Figure 2H:
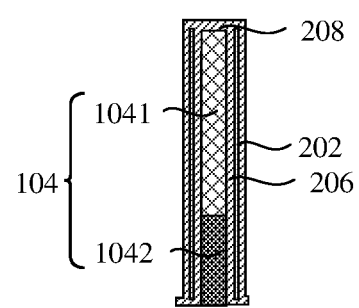

As shown in FIG. 2H, initial third insulating layers 208 are formed on surfaces of the initial second insulating layers 206 and surfaces of the sacrificial layers 202.

Herein, S1413 may be implemented by the following operation. The initial third insulating layers are formed on the surfaces of the initial second insulating layers and the surfaces of the sacrificial layers by using a deposition process such as a physical vapor deposition process, a chemical vapor deposition process, a low pressure chemical vapor deposition process, a molecular layer deposition process, a plasma enhanced vapor deposition process, and an atomic layer deposition process.

The material for the initial third insulating layers may include oxide, such as silicon oxide and aluminum oxide. The material for the initial third insulating layers may be the same as or different from the material for the initial second insulating layers.

At S1414, the initial third insulating layers and the initial second insulating layers located above the tops of the bit line structures are etched, to expose part of the surfaces of the sacrificial layers, to form the second insulating layers, the sacrificial layers, and the third insulating layers that are successively formed on the two side walls of the bit line structures.

Figure 2I:
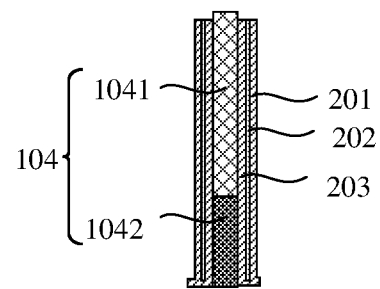

With reference to FIG. 2H and FIG. 2I, the initial third insulating layers 208 and the initial second insulating layers 206 located above the tops of the bit line structures 104 are etched, to expose part of the surfaces of the sacrificial layer 202, to form the second insulating layers 203, the sacrificial layers 202, and the third insulating layers 201 that are successively formed on the two side walls of the bit line structures 104.

Herein, S1414 may be implemented by the following operation. The initial third insulating layers and the initial second insulating layers located above the tops of the bit line structures are etched by using a dry etching process, such as a reactive ion etching technology and a plasma etching technology.

Figure 3A:
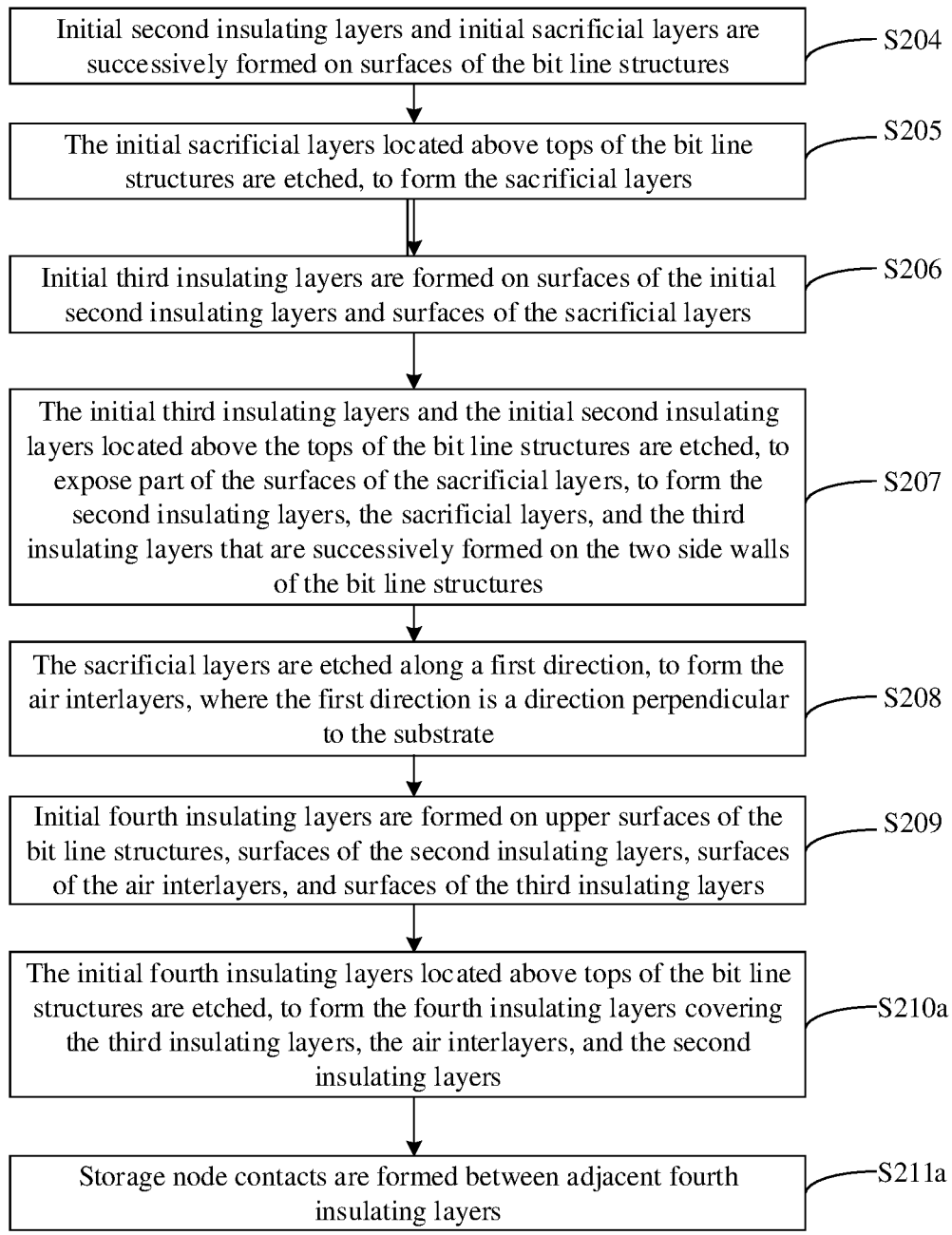
FIG. 3A is a schematic flowchart of another method for forming a semiconductor structure according to an embodiment of this disclosure.

An embodiment of this disclosure further provides a method for forming a semiconductor structure. As shown in FIG. 3A, the method includes the following operations.

For S201 to S203, references may be made to S101 to S103.

At S204, initial second insulating layers and initial sacrificial layers are successively formed on surfaces of the bit line structures.

At S205, the initial sacrificial layers located above tops of the bit line structures are etched, to form the sacrificial layers.

At S206, initial third insulating layers are formed on surfaces of the initial second insulating layers and surfaces of the sacrificial layers.

At S207, the initial third insulating layers and the initial second insulating layers located above the tops of the bit line structures are etched, to expose part of the surfaces of the sacrificial layers, to form the second insulating layers, the sacrificial layers, and the third insulating layers that are successively formed on the two side walls of the bit line structures.

Herein, for S204 to S207, references may be made to S1411 to S1414.

At S208, the sacrificial layers are etched along a first direction, to form the air interlayers, where the first direction is a direction perpendicular to the substrate.

Herein, for S208, references may be made to S1042.

At S209, initial fourth insulating layers are formed on upper surfaces of the bit line structures, surfaces of the second insulating layers, surfaces of the air interlayers, and surfaces of the third insulating layers.

At S210a, the initial fourth insulating layers located above tops of the bit line structures are etched, to form the fourth insulating layers covering the third insulating layers, the air interlayers, and the second insulating layers.

Herein, for S209 and S210a, references may be respectively made to S1431 and S1432.

At S211a, storage node contacts are formed between adjacent fourth insulating layers.

Herein, the storage node contacts may include polysilicon doped with impurities or polysilicon without impurities.

Figure 3B:
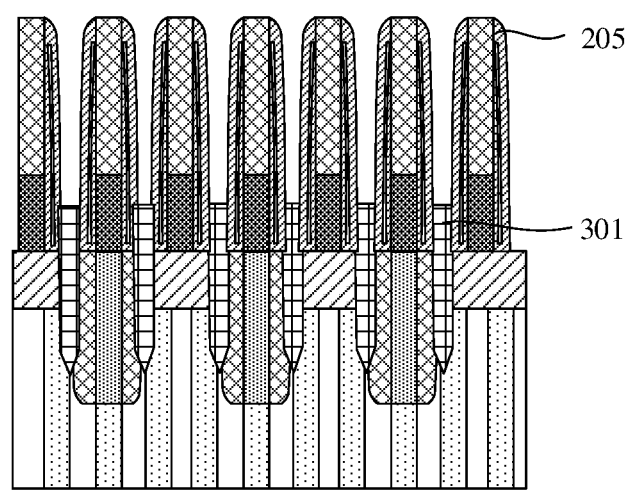
FIG. 3B to FIG. 3D are a schematic diagram of a process of another method for forming a semiconductor structure according to an embodiment of this disclosure.

As shown in FIG. 3B, storage node contacts 301 are formed between adjacent fourth insulating layers 205.

In some other embodiments, after 209, the method further includes S210b to S212b.

At S210b, fifth insulating layers are formed on surfaces of the initial fourth insulating layers.

Herein, the material for the fifth insulating layers may include oxide, such as silicon oxide and aluminum oxide. The material of the fifth insulating layers may be the same as the material of the fourth insulating layers, or may be different from the material of the fourth insulating layers.

Figure 3C:
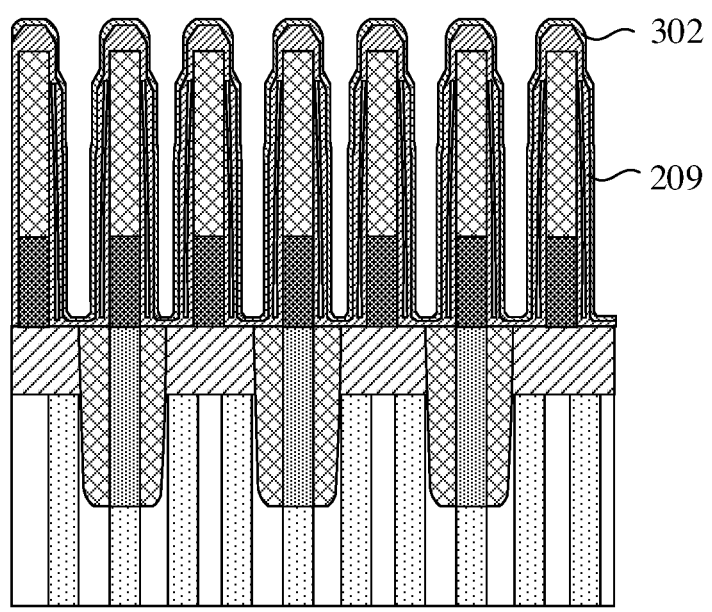

As shown in FIG. 3C, fifth insulating layers 302 are formed on surfaces of the initial fourth insulating layers 209. For the structure of the initial fourth insulating layers 209, references may be made to FIG. 2D.

At S211b, the fifth insulating layers, the initial fourth insulating layers located on the surface of the substrate, and part of the substrate are etched, to expose the substrate.

Figure 3D:
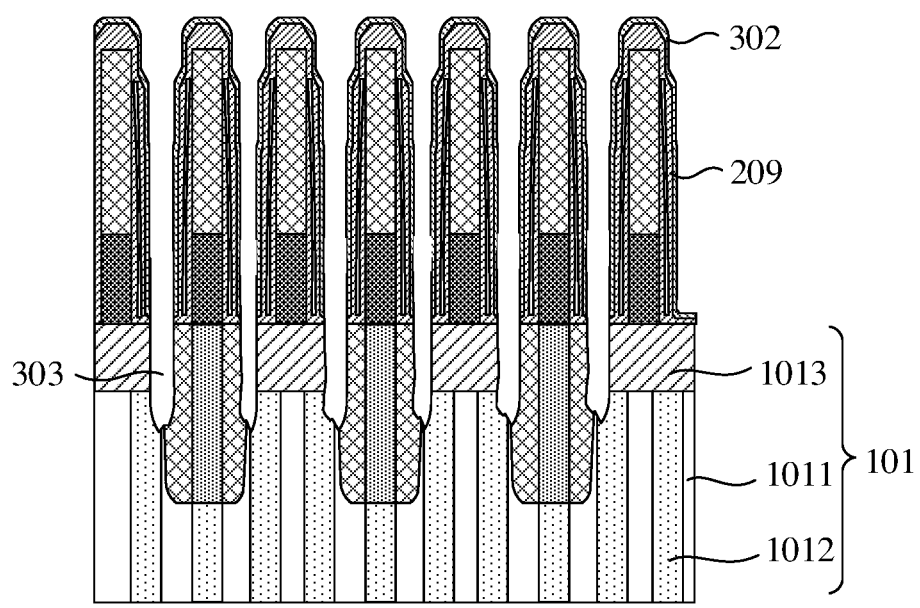

As shown in FIG. 3D, the fifth insulating layers 302, the initial fourth insulating layers 209 located on the surface of the substrate 101, and part of the substrate 101 are etched by using a dry etching process, to expose the substrate 101, that is, blank areas 303 in the substrate in FIG. 3D.

At S212b, the initial fourth insulating layers and the fifth insulating layers located on the upper surfaces of the bit line structures are etched, to form the fourth insulating layers covering the third insulating layers, the air interlayers, and the second insulating layers.

At S213b, storage node contacts are formed between adjacent fourth insulating layers.

In this embodiment of this disclosure, fifth insulating layers are formed on surfaces of the initial fourth insulating layers, then the fifth insulating layers, the initial fourth insulating layers located on the surface of the substrate, and part of the substrate are etched. In this embodiment, the fifth insulating layers protect the fourth insulating layers, which reduce the risk of etching away the fourth insulating layers on the surfaces of the bit line structures during etching, thereby protecting the insulation structures.

An embodiment of this disclosure further provides a method for forming a semiconductor structure. After S211a or S213b, the method includes the following operations.

At S301, metal layers are formed on surfaces of the insulation structures, surfaces of the storage node contacts, and the upper surfaces of the bit line structures.

Herein, the material for the metal layers may be a conductive material, for example, tungsten (W). The conductive material is deposited by using a plasma enhanced chemical vapor deposition (PECVD) process, to reduce the possibility of voids during filling. In some embodiments, the conductive material may alternatively be deposited by using suitable processes such as a chemical vapor deposition process, a low pressure chemical vapor deposition process, and an atomic layer deposition process.

Figure 4A:
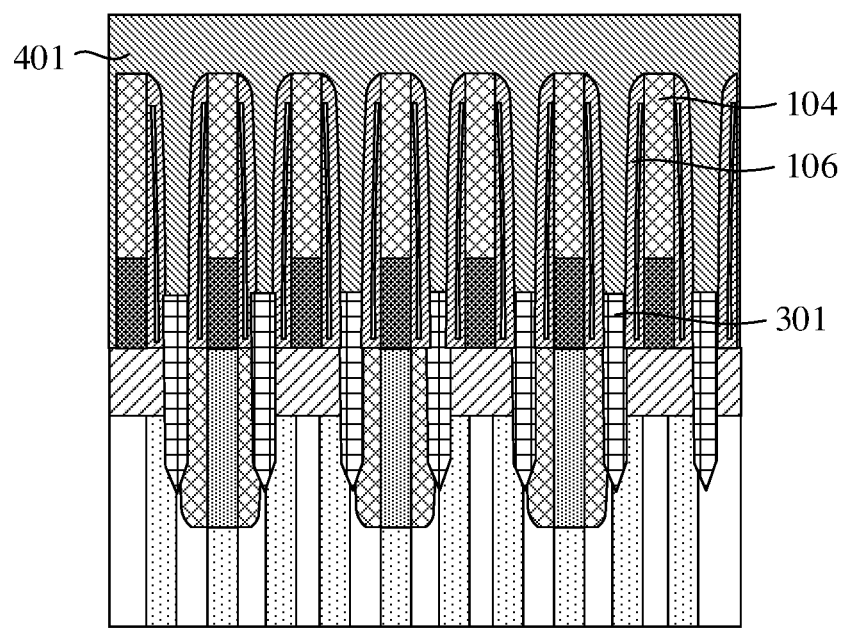
FIG. 4A to FIG. 4G are a schematic diagram of a process of another method for forming a semiconductor structure according to an embodiment of this disclosure.

For S301, references may be made to FIG. 4A, in which metal layers 401 are formed on the surfaces of the insulation structures 106, the surfaces of the storage node contacts 301, and the upper surfaces of the bit line structures 104.

At S302, part of the metal layers is etched to form first openings, to expose part of surfaces of the insulation structures located on first side walls of the bit line structures.

The remaining part of the metal layers after etching forms landing pads electrically connected to the storage node contacts, and the landing pads cover the surfaces of the storage node contact, surfaces of the insulation structures located on second side walls of the bit line structures, and the upper surfaces of the bit line structures.

Herein, the metal layers may be selectively etched by using a dry etching process or a wet etching process, and the etching gas may be hydrogen bromide (HBr)/chlorine ($Cl_2$). The landing pads are configured to electrically connect the storage node contacts to a capacitor.

Figure 4B:
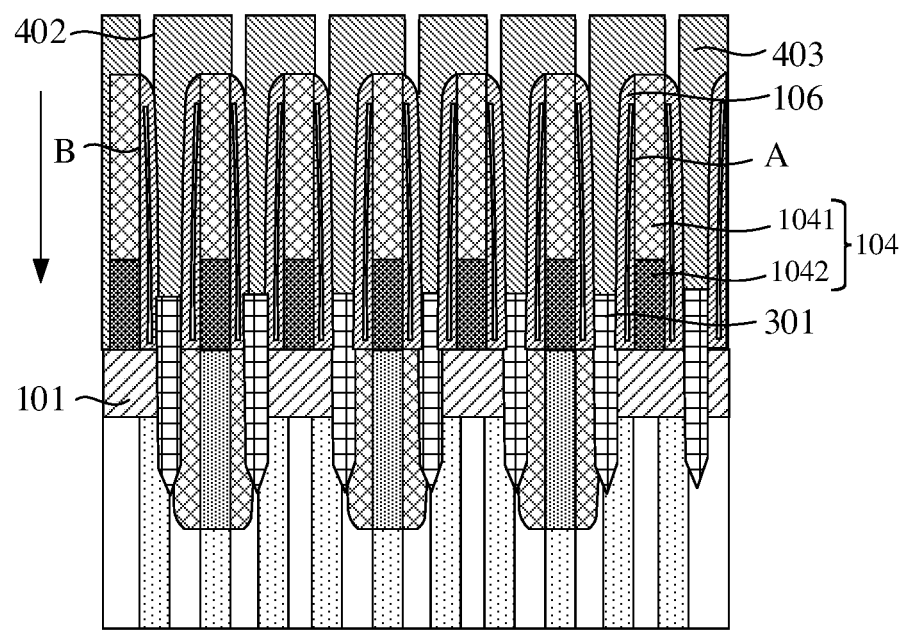

For S302, references may be made to FIG. 4B and FIG. 4A. As shown in FIG. 4A, part of the metal layers 401 is etched to form first openings 402 shown in FIG. 4B, to expose part of the surfaces of the insulation structures 106 located on first side walls B of the bit line structures 104.

The remaining part of the metal layers after etching forms landing pads 403 electrically connected to the storage node contacts 301, and the landing pads 403 cover the surfaces of the storage node contacts 301, surfaces of the insulation structures 106 located on second side walls A of the bit line structures, and the upper surfaces of the bit line structures 104.

At S303a, isolation structures are formed between adjacent landing pads and on surfaces of the landing pads.

Herein, the material of the isolation structures may be oxide of silicon, nitride of silicon (for example, $Si_3N_4$), silicon oxynitride, or the like.

Figure 4C:
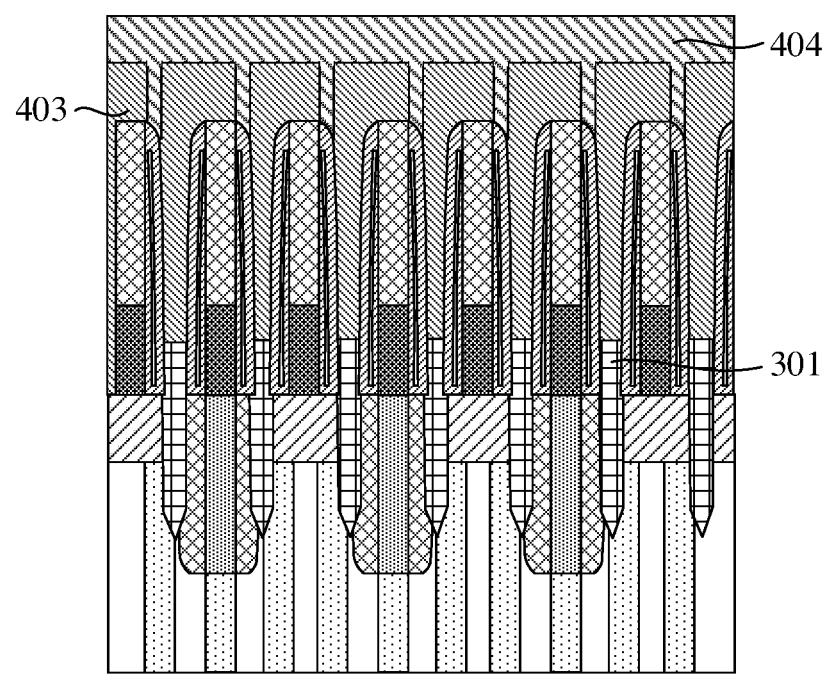

For S303a, references may be made to FIG. 4C, isolation structures 404 are formed between adjacent landing pads 403 and on surfaces of the landing pads 403.

In some embodiments, the isolation structures include first filling layers and second filling layers. The operation that "isolation structures are formed between adjacent landing pads and on surfaces of the landing pads" at S303a correspondingly includes S33a1 and S33a2.

At S33a1, first filling layers are deposited on the surfaces of the landing pads and the surfaces of the insulation structures located on the first side walls of the bit line structures.

Figure 4D:
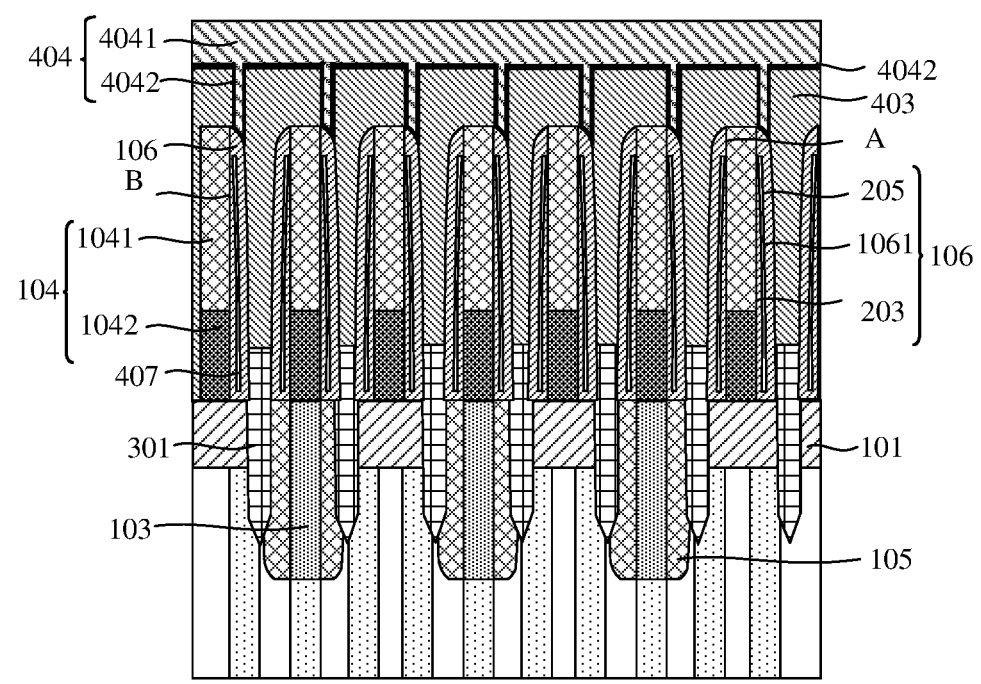

Herein, for S33a1, references may be made to FIG. 4D, first filling layers 4042 are deposited on the surfaces of the landing pads 403 and the surfaces of the insulation structures 106 located on the first side walls B of the bit line structures 104.

In some embodiments, the material for the first filling layers may be the same as the material for at least one of the second insulating layers, the third insulating layers, or the fourth insulating layers in the insulation structures, or may be different from the material for the second insulating layers, the third insulating layers, and the fourth insulating layers in the insulation structures.

At S33a2, second filling layers are deposited on surfaces of the first filling layers.

Herein, for S33a2, references may be made to FIG. 4D, second filling layers 4041 are deposited on surfaces of the first filling layers 4042. The material of the second filling layers may be the same as or different from the material of the first filling layers.

In this embodiment of this disclosure, metal layers are formed on the surfaces of the insulation structures, the surfaces of the storage node contacts, and the surfaces of the bit line structures, then part of the metal layers is etched to form first openings, to expose part of the surfaces of the insulation structures located on the first side walls of the bit line structures, landing pads are formed, and subsequently isolation structures are formed between adjacent landing pads and on the surfaces of the landing pads to form landing pads isolated from each other. In this way, the NCs are connected to the other parts in the semiconductor structure by using the landing pads isolated from each other in a case that the insulation structures have air interlayers.

An embodiment of this disclosure provides a semiconductor structure. As shown in FIG. 4D, the semiconductor structure includes:

a substrate 101;

bit line contact holes (holes in which the first insulating layers 105 are located) spaced apart from each other, bit line contacts 103 each in contact with a part of a respective one of the bit line contact holes, and bit line structures 104, where the bit line contact holes, the bit line contacts 103 and the bit line structures 104 are located on the substrate 101, each of the bit line structures 104 includes at least a conductive layer 1042 and an insulating cap layer 1041, and the insulating cap layer 1041 is located on the conductive layer 1042;

first insulating layers 105 located inside the bit line contact holes, where the first insulating layers 105 completely fill the bit line contact holes; and insulation structures 106 with air interlayers 1061 located on two side walls of the bit line structures 104, where a height of each of the air interlayers 1061 is greater than a height of the conductive layer 1042 of each of the bit line structures 104, and the insulation structures 106 include second insulating layers 203, air interlayers 1061, third insulating layers, and fourth insulating layers 205 that are successively stacked onto one another, where the fourth insulating layers 205 cover the third insulating layers, the air interlayers 1061, and the second insulating layers 203, and the insulation structures 106 may be understood with reference to FIG. 2E;

storage node contacts 301 between adjacent fourth insulating layers 205;

landing pads 403 covering the storage node contacts 301, the insulation structures 106 located on the second side walls A, and upper surfaces of the bit line structures 104, where the landing pads 403 are electrically connected to the storage node contacts 301; and isolation structures 404 located between adjacent landing pads 403 and on surfaces of the landing pads 403.

In some embodiments, the isolation structures 404 include first filling layers 4042 and second filling layers 4041, where the first filling layers 4042 are located on surfaces of the landing pads 403 and surfaces of the insulation structures 106 located on the first side walls B of the bit line structures 104, and the second filling layers 4041 are located on surfaces of the first filling layers 4042.

An embodiment of this disclosure further provides a method for forming a semiconductor structure. After S302, the method further includes the following operations.

At S303b, each of the first openings is etched along the first direction with a height of an etching stop position greater than the height of the conductive layer of each of the bit line structures, to form second openings. The air interlayers close to the first side walls are first air interlayers with a first height, and the air interlayers close to the second side walls are second air interlayers with a second height, in which the first height is less than the second height.

Figure 4E:
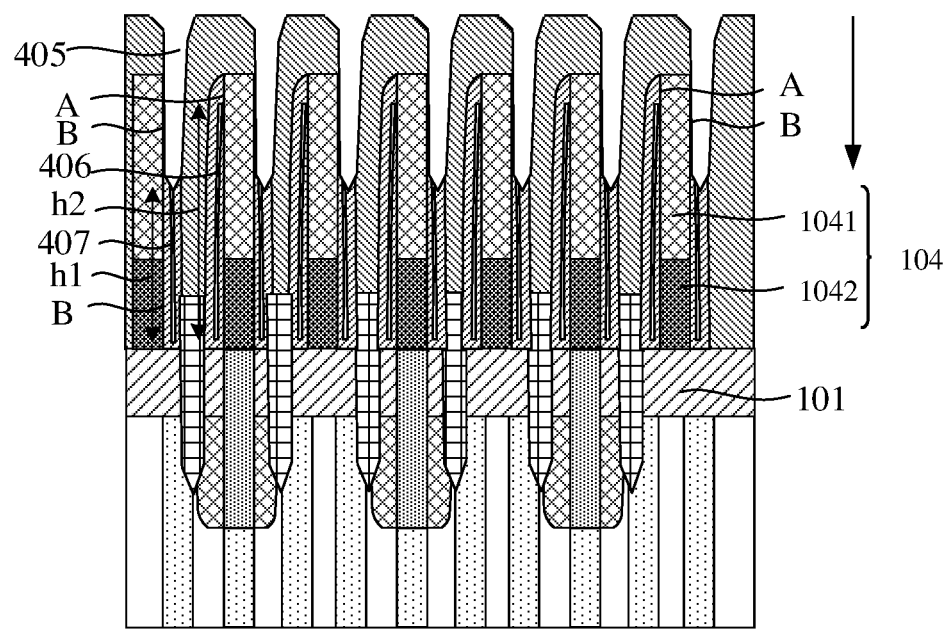

For S303b, references may be made to FIG. 4E and FIG. 4B. As shown in FIG. 4B, the first direction is a direction perpendicular to the substrate 101, that is, the direction indicated by the arrow in the figure. Each of the first openings 402 is etched along the first direction with a height of an etching stop position greater than the height of the conductive layer 1042 of each of the bit line structures 104, to form second openings 405 shown in FIG. 4E. The air interlayers close to the first side walls B are first air interlayers 407 with a first height h1, and the air interlayers close to the second side walls A are second air interlayers 406 with a second height h2. The first side walls B are right side walls of all the bit line structures 104 in FIG. 4E, and the second side walls A are left side walls of all the bit line structures 104 in FIG. 4E. That is, the air interlayers close to the right side walls of the bit line structures 104 are first air interlayers 407 with the first height h1, and the air interlayers close to the left side walls of the bit line structures 104 are second air interlayers 406 with the second height h2, in which the first height h1 is less than the second height h2.

At S304b, isolation structures are formed between adjacent landing pads and on surfaces of the landing pads.

Figure 4F:
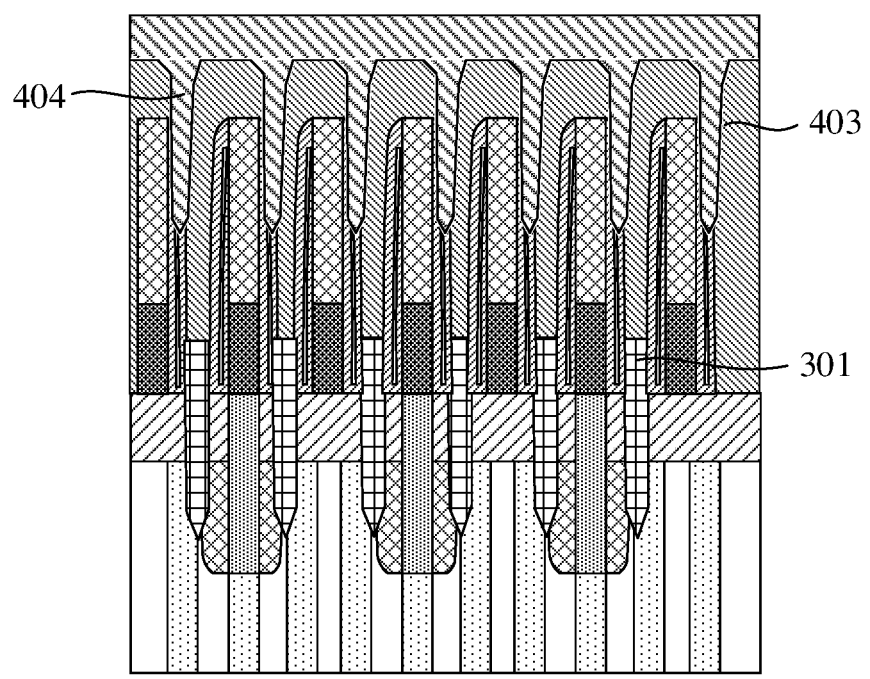

For S304b, reference may be made to FIG. 4F, in which isolation structures 404 are formed between adjacent landing pads 403 and on surfaces of the landing pads 403.

In some embodiments, the isolation structures include first filling layers and second filling layers, and the operation that "isolation structures are formed between adjacent landing pads and on surfaces of the landing pads" at S304b correspondingly includes S34b1 and S34b2.

At S34b1, first filling layers are deposited on surfaces of the landing pads and surfaces of the insulation structures located on the first side walls of the bit line structures.

Figure 4G:
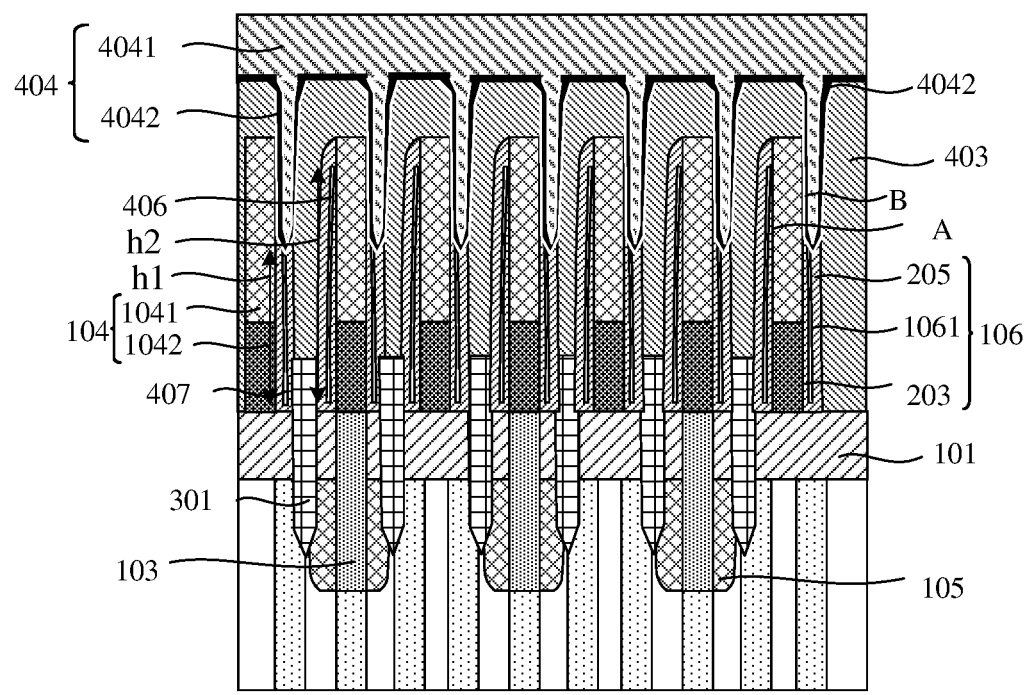

Herein, for S34b1, references may be made to FIG. 4G, in which first filling layers 4042 re deposited on surfaces of the landing pads 403 and surfaces of the insulation structures 106 located on the first side walls B of the bit line structures 104.

In some embodiments, the material for the first filling layers may be the same as the material for at least one of the second insulating layers, the third insulating layers or the fourth insulating layers in the insulation structures 106, to close openings of the first air interlayers 407, thereby forming closed first air interlayers 407.

At S34b2, second filling layers are deposited on surfaces of the first filling layers.

Herein, for S34b2, reference may be made to FIG. 4G, in which second filling layers 4041 are deposited on surfaces of the first filling layers 4042. The material of the second filling layers may be the same as or different from the material of the first filling layers.

The isolation structures in this embodiment of this disclosure include first filling layers and second filling layers. The openings of the first air interlayers are closed by the first filling layers in the isolation structures to form closed first air interlayers, and then second filling layers are deposited on the surfaces of the first filling layers, to form isolation structures. In this way, first air interlayers and second air interlayers with different heights are obtained. The height of each of the first air interlayers is greater than the height of the conductive layer of each of the bit line structures, which plays a role of decreasing parasitic capacitance between the NC and the BL. In addition, because the height of each of the first air interlayers is less than the height of each of the second air interlayers, compared with the case in which the height of each of the first air interlayers is the same as the height of each of the second air interlayers, a part of the space is reserved for the landing pads, making the thickness of the landing pads greater, thereby reducing the resistance of the landing pads, and enhancing the conductivity of the landing pads.

An embodiment of this disclosure provides a semiconductor structure. As shown in FIG. 4G, the semiconductor structure includes:

a substrate 101;

bit line contact holes (holes in which the first insulating layers 105 are located) spaced apart from each other, bit line contacts 103 each in contact with a part of a respective one of the bit line contact holes, and bit line structures 104, where the bit line contact holes, the bit line contacts 103 and the bit line structures 104 are located on the substrate 101, each of the bit line structures 104 includes at least a conductive layer 1042 and an insulating cap layer 1041, and the insulating cap layer 1041 is located on the conductive layer 1042;

first insulating layers 105 located inside the bit line contact holes, where the first insulating layers 105 completely fill the bit line contact holes; and insulation structures 106 with air interlayers 1061 located on two side walls of the bit line structures 104, where a height of each of the air interlayers 1061 is greater than a height of the conductive layer 1042 of each of the bit line structures 104, and the insulation structures 106 include second insulating layers 203, air interlayers 1061, third insulating layers, and fourth insulating layers 205 that are successively stacked onto one another, where the fourth insulating layers 205 cover the third insulating layers, the air interlayers 1061, and the second insulating layers 203. Herein, the insulation structure 106 may be understood with reference to FIG. 2E.

In some embodiments, the air interlayers include first air interlayers 407 having a first height h1 and second air interlayers 406 having a second height h2, where the first air interlayers 407 are close to first side walls B of the bit line structures 104, the second air interlayers 406 are close to second side walls A of the bit line structures 104, and the first height h1 is less than the second height h2.

The semiconductor structure further includes: storage node contacts 301 between adjacent fourth insulating layers 205;

landing pads 403 covering the storage node contact 301, the insulation structures 106 located on the second side walls A, and upper surfaces of the bit line structures 104, where the landing pads 403 are electrically connected to the storage node contacts 301; and isolation structures 404 between adjacent landing pads 403 and on surfaces of the landing pads 403.

In some embodiments, the isolation structures 404 include first filling layers 4042 and second filling layers 4041, where the first filling layers 4042 are located on surfaces of the landing pads 403 and surfaces of the insulation structures 106 located on the first side walls B of the bit line structures 104, and the second filling layers 4041 are located on surfaces of the first filling layers 4042.

The embodiments of this disclosure provide a semiconductor structure and a method for forming a semiconductor structure. The method includes the following operations. A substrate is provided. Bit line contact holes spaced apart from each other, bit line contacts each in contact with a part of a respective one of the bit line contact holes, and bit line structures are formed on the substrate. Each of the bit line structures includes at least a conductive layer and an insulating cap layer, and the insulating cap layer is located on the conductive layer. First insulating layers completely filling the bit line contact holes are formed inside the bit line contact holes. Insulation structures with air interlayers are formed on two side walls of the bit line structures, where a height of each of the air interlayers is greater than a height of the conductive layer of each of the bit line structures.

In this embodiment of this disclosure, bit line contact holes spaced apart from each other, bit line contacts each in contact with a part of a respective one of the bit line contact holes, and bit line structures are formed on the substrate; first insulating layers completely filling the bit line contact holes are formed inside the bit line contact holes; and insulation structures with air interlayers are formed on two side walls of the bit line structures, where the height of each of the air interlayers is greater than the height of the conductive layer of each of the bit line structures. In this way, a new method for forming a bit line structure spacer is provided, that is, a new method for forming insulation structures with air interlayers is provided. Because the insulation structures having air interlayers is located between the BL and the NC, and the dielectric constant of the air interlayers is less than the dielectric constant of an insulating layer of an insulation structure without an air interlayer, the parasitic capacitance between the NC and the BL is reduced, and the read capacity of the memory is improved.

The features disclosed in the method embodiments and the features disclosed in the structure embodiments provided in this disclosure may be arbitrarily combined with each other without conflict, to obtain a new method embodiment or structure embodiment.

The descriptions of the semiconductor structure embodiments above are similar to the descriptions of the foregoing method embodiments, and have similar beneficial effects to the method embodiments. For technical details not disclosed in the semiconductor structure embodiments of this disclosure, reference may be made to the description of the method embodiments of this disclosure for understanding.

The foregoing descriptions are only exemplary embodiments of this disclosure, and are not intended to limit the protection scope of this disclosure. Any modifications, equivalent replacements, and improvements made within the spirit and principle of this disclosure shall fall within the protection scope of this disclosure.

The invention claimed is:

1. A method for forming a semiconductor structure, comprising:

providing a substrate;

forming bit line contact holes spaced apart from each other, bit line contacts each in contact with a part of a respective one of the bit line contact holes, and bit line structures on the substrate, wherein each of the bit line structures comprises at least a conductive layer and an insulating cap layer, and the insulating cap layer is located on the conductive layer;

forming first insulating layers completely filling the bit line contact holes inside the bit line contact holes;

successively forming initial second insulating layers and initial sacrificial layers on surfaces of the bit line structures;

etching the initial sacrificial layers located above tops of the bit line structures, to form sacrificial layers;

forming initial third insulating layers on surfaces of the initial second insulating layers and surfaces of the sacrificial layers;

etching the initial third insulating layers and the initial second insulating layers located above the tops of the bit line structures, to expose part of the surfaces of the sacrificial layers, to form second insulating layers, the sacrificial layers, and third insulating layers that are successively formed on two side walls of the bit line structures;

etching the sacrificial layers along a first direction to form air interlayers, wherein the first direction is a direction perpendicular to the substrate; and forming fourth insulating layers covering the third insulating layers, the air interlayers, and the second insulating layers, to obtain insulation structures with the air interlayers on the two side walls of the bit line structures, wherein the insulation structures comprise the second insulating layers, the air interlayers, the third insulating layers, and the fourth insulating layers that are successively stacked onto one another; wherein a height of each of the air interlayers is greater than a height of the conductive layer of each of the bit line structures.

2. The method according to claim 1, wherein the etching the sacrificial layers along a first direction to form the air interlayers comprises:

etching the sacrificial layers along the first direction by using a dry etching process to form the air interlayers.

3. The method according to claim 1, wherein the forming fourth insulating layers covering the third insulating layers, the air interlayers, and the second insulating layers comprises:

forming initial fourth insulating layers on upper surfaces of the bit line structures, surfaces of the second insulating layers, surfaces of the air interlayers, and surfaces of the third insulating layers; and etching the initial fourth insulating layers located above tops of the bit line structures, to form the fourth insulating layers covering the third insulating layers, the air interlayers, and the second insulating layers.

4. The method according to claim 3, wherein after forming the fourth insulating layers, the method further comprises:

forming storage node contacts between adjacent fourth insulating layers.

5. The method according to claim 4, further comprising:

forming metal layers on surfaces of the insulation structures, surfaces of the storage node contacts, and the upper surfaces of the bit line structures; and etching part of the metal layers, to form first openings, to expose part of surfaces of the insulation structures located on first side walls of the bit line structures, wherein a remaining part of the metal layers after etching forms landing pads electrically connected to the storage node contacts, and the landing pads cover the surfaces of the storage node contacts, surfaces of the insulation structures located on second side walls of the bit line structures, and the upper surfaces of the bit line structures.

6. The method according to claim 5, further comprising:

etching each of the first openings along the first direction with a height of an etching stop position greater than the height of the conductive layer of each of the bit line structures, to form second openings, wherein air interlayers close to the first side walls are first air interlayers with a first height, air interlayers close to the second side walls are second air interlayers with a second height, and the first height is less than the second height.

7. The method according to claim 5, further comprising:

forming isolation structures between adjacent landing pads and on surfaces of the landing pads.

8. The method according to claim 7, wherein the isolation structures comprise first filling layers and second filling layers, and wherein the forming isolation structures between adjacent landing pads and on surfaces of the landing pads comprises:

depositing first filling layers on the surfaces of the landing pads and the surfaces of the insulation structures located on the first side walls of the bit line structures; and depositing second filling layers on surfaces of the first filling layers.

9. The method according to claim 4, wherein before the forming storage node contacts between adjacent fourth insulating layers, the method further comprises:

forming fifth insulating layers on surfaces of the initial fourth insulating layers; and etching the fifth insulating layers, the initial fourth insulating layers located on the surface of the substrate, and part of the substrate, to expose the substrate;

wherein the etching the initial fourth insulating layers located above tops of the bit line structures, to form the fourth insulating layers covering the third insulating layers, the air interlayers, and the second insulating layers comprises:

etching the initial fourth insulating layers and the fifth insulating layers located on the upper surfaces of the bit line structures, to form the fourth insulating layers covering the third insulating layers, the air interlayers, and the second insulating layers.

10. The method according to claim 1, wherein the material of the first insulating layers comprises nitride; and the material of the second insulating layers, the material of the third insulating layers, and the material of the fourth insulating layers comprise oxide.

11. The method according to claim 1, wherein the material of the sacrificial layers comprises silicon.

12. A semiconductor structure, comprising:

a substrate;

bit line contact holes spaced apart from each other, bit line contacts each in contact with a part of a respective one of the bit line contact holes, and bit line structures, wherein the bit line contact holes, the bit line contacts and the bit line structures are located on the substrate, each of the bit line structures comprises at least a conductive layer and an insulating cap layer, and the insulating cap layer is located on the conductive layer;

first insulating layers located inside the bit line contact holes, wherein the first insulating layers completely fill the bit line contact holes; and insulation structures with air interlayers located on two side walls of the bit line structures, wherein a height of each of the air interlayers is greater than a height of the conductive layer of each of the bit line structures;

wherein the semiconductor structure is manufactured by a method comprising:

providing a substrate;

forming bit line contact holes spaced apart from each other, bit line contacts each in contact with a part of a respective one of the bit line contact holes, and bit line structures on the substrate, wherein each of the bit line structures comprises at least a conductive layer and an insulating cap layer, and the insulating cap layer is located on the conductive layer;

forming first insulating layers completely filling the bit line contact holes inside the bit line contact holes;

successively forming initial second insulating layers and initial sacrificial layers on surfaces of the bit line structures;

etching the initial sacrificial layers located above tops of the bit line structures, to form sacrificial layers;

forming initial third insulating layers on surfaces of the initial second insulating layers and surfaces of the sacrificial layers;

etching the initial third insulating layers and the initial second insulating layers located above the tops of the bit line structures, to expose part of the surfaces of the sacrificial layers, to form second insulating layers, the sacrificial layers, and third insulating layers that are successively formed on two side walls of the bit line structures;

etching the sacrificial layers along a first direction to form air interlayers, wherein the first direction is a direction perpendicular to the substrate; and forming fourth insulating layers covering the third insulating layers, the air interlayers, and the second insulating layers, to obtain insulation structures with the air interlayers on the two side walls of the bit line structures, wherein the insulation structures comprise the second insulating layers, the air interlayers, the third insulating layers, and the fourth insulating layers that are successively stacked onto one another; wherein a height of each of the air interlayers is greater than a height of the conductive layer of each of the bit line structures.

13. The semiconductor structure according to claim 12, wherein the insulation structures comprise second insulating layers, air interlayers, third insulating layers, and fourth insulating layers that are successively stacked onto one another, wherein the fourth insulating layers cover the third insulating layers, the air interlayers, and the second insulating layers.

14. The semiconductor structure according to claim 13, wherein the air interlayers comprise first air interlayers with a first height and second air interlayers with a second height, wherein the first air interlayers are close to first side walls of the bit line structures, the second air interlayers are close to second side walls of the bit line structures, and the first height is less than the second height.

15. The semiconductor structure according to claim 14, further comprising:

storage node contacts between adjacent fourth insulating layers; and landing pads covering the storage node contacts, the insulation structures located on second side walls, and upper surfaces of the bit line structures, wherein the landing pads are electrically connected to the storage node contacts.

16. The semiconductor structure according to claim 15, further comprising:

isolation structures between adjacent landing pads and on surfaces of the landing pads.

17. The semiconductor structure according to claim 16, wherein the isolation structures comprise first filling layers and second filling layers, wherein the first filling layers are located on the surfaces of the landing pads and surfaces of the insulation structures located on first side walls of the bit line structures, and the second filling layers are located on surfaces of the first filling layers.

* * * * *